United States Patent
Wu

(10) Patent No.: US 7,284,896 B2
(45) Date of Patent: Oct. 23, 2007

(54) LIGHT UNIT DISPLAY

(76) Inventor: Jiahn-Chang Wu, No. 15, Lane 13, Alley 439, Her-Chiang Street, Chutung, Hsin-Chu (TW) 310

( * ) Notice: Subject to any disclaimer, the term of this patent is extended or adjusted under 35 U.S.C. 154(b) by 113 days.

(21) Appl. No.: 11/105,745

(22) Filed: Apr. 15, 2005

(65) Prior Publication Data

US 2006/0232966 A1    Oct. 19, 2006

(51) Int. Cl.
*H01L 29/22* (2006.01)
(52) U.S. Cl. ............... 362/646; 362/652; 362/267; 257/100
(58) Field of Classification Search ........... 362/310, 362/267, 800, 249, 646, 652, 655, 656; 257/99, 257/100, 81, 727
See application file for complete search history.

(56) References Cited

U.S. PATENT DOCUMENTS

| | | | |
|---|---|---|---|
| 4,074,299 A * | 2/1978 | Kusano et al. | 257/93 |
| 6,653,725 B2 * | 11/2003 | Ahn et al. | 257/690 |
| 6,998,650 B1 * | 2/2006 | Wu | 257/100 |
| 2004/0227146 A1 * | 11/2004 | Wu | 257/99 |
| 2005/0035366 A1 * | 2/2005 | Imai | 257/100 |
| 2006/0262533 A1 * | 11/2006 | Lin et al. | 362/249 |

* cited by examiner

*Primary Examiner*—Thomas M. Sember
(74) *Attorney, Agent, or Firm*—H. C. Lin

(57) ABSTRACT

A light emitting device with a top electrode and a bottom electrode is pushed by a plug to make contacts with either an upper metal plate or a lower metal plate each serving as one of the leads for an electrode of the light emitting devices. The plug is inserted through an opening larger than the light emitting device in the metal plate not in contact with the light emitting device but serving as another lead for the light emitting device. The plug is locked in place by means of threaded screw heads, snug-fit, snap-on buttons or an elastic sleeve. Thus, the light emitting device can be easily replaced without any wire bonding. A plurality of the light unit can be sandwiched between the upper metal plate and the lower metal plate.

5 Claims, 16 Drawing Sheets

LIGHT UNIT DISPLAY

BACKGROUND OF THE INVENTION

1. Filed of the Invention

This invention relates to a light display unit, in particular to a display unit with a plurality of individual replaceable light emitting devices.

2. Brief Description of Prior Art

In USPTO publication 2004/0227146, a light emitting device 20 was disclosed as shown in FIG. 1. A plurality of two-electrode light emitting diode (LED) 10 are sandwiched between two metal plates: an upper metal plate 11 and a lower metal plate 12. The upper metal plate 11 is coupled to the surface electrode 101 of the light emitting device 10, and the lower metal plate 12 is coupled to the bottom electrode 102 of the LED 10. The metal plates are clamped together to form a light display unit. Insulation layer 13 is between the upper metal plate 11 and the lower metal plate.

The light display panel 100 comprises a large number of such light display units 20 as shown in FIG. 2. Each light display unit 20 is wire bonded to a common substrate 15 through wire 14 to form the display panel 100. The shortcoming of this structure is that when one of the LEDs is defective or when one of the LEDs needs to change color, it is difficult to disassemble the display unit 20.

SUMMARY OF THE INVENTION

An object of this present invention is to provide a light emitting unit which can be readily replaced. Another object of the present invention is to provide means for replacing a defective light emitting unit in a display panel. Still another object of the present invention is to provide means to change the color pattern of a LED display panel.

These objects are achieved by not using any wire bonding, but using a pressure sleeve to make pressure contact to the top electrode of the LED and to make electrical contact with the upper metal plate. The sleeve is inserted through the upper metal plate in a hole larger than the LED die size, after the LED is inserted through the hole. An end of the sleeve presses against the top electrodes of the LED to make electrical contact and to fix the position of the LED. The core of the sleeve allows transmission of the light emitted by the LED. When the LED is to be replaced, the sleeve is lifted from the hole and another LED is inserted through the hole. The sleeve can be locked in place with screw-thread, snug-fit, snap-on buttons, or slotted elastic tubing.

Alternatively, a plug is inserted through the lower metal plate to push the LED against the upper metal plate. Similar means can lock the plug to the lower metal plate.

DETAILED DESCRIPTION OF THE INVENTION

Figure 1:
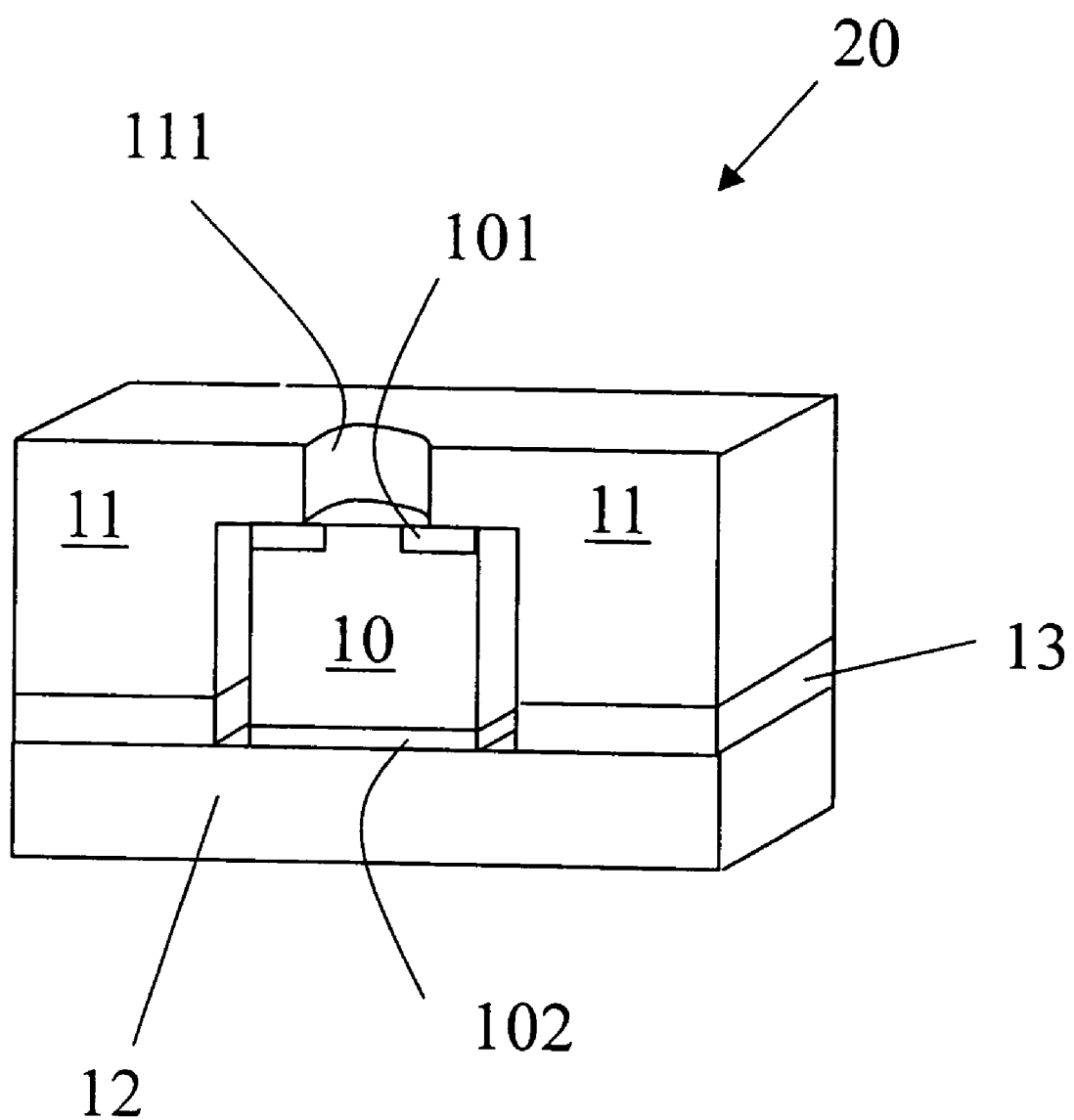
FIG. 1 shows a prior art LED unit of a display panel.
Figure 2:
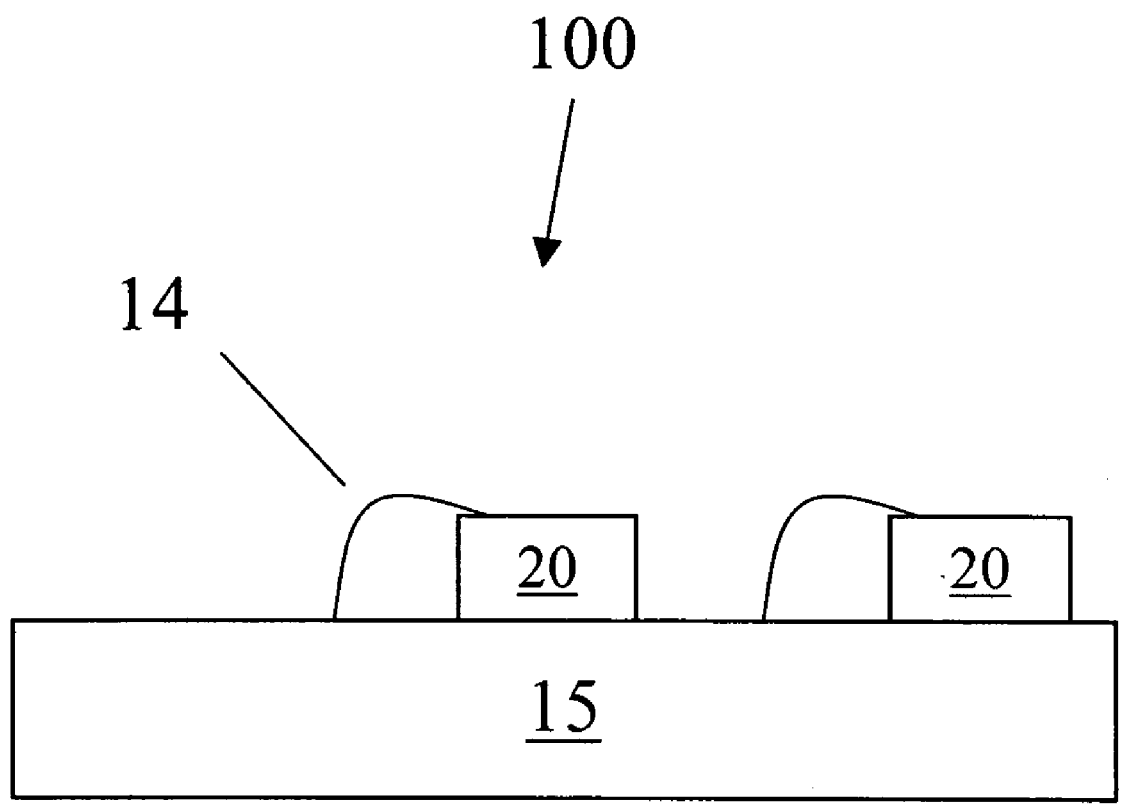
FIG. 2 shows wire bonding to a number of LED units to a common substrate of a light panel.
Figure 3:
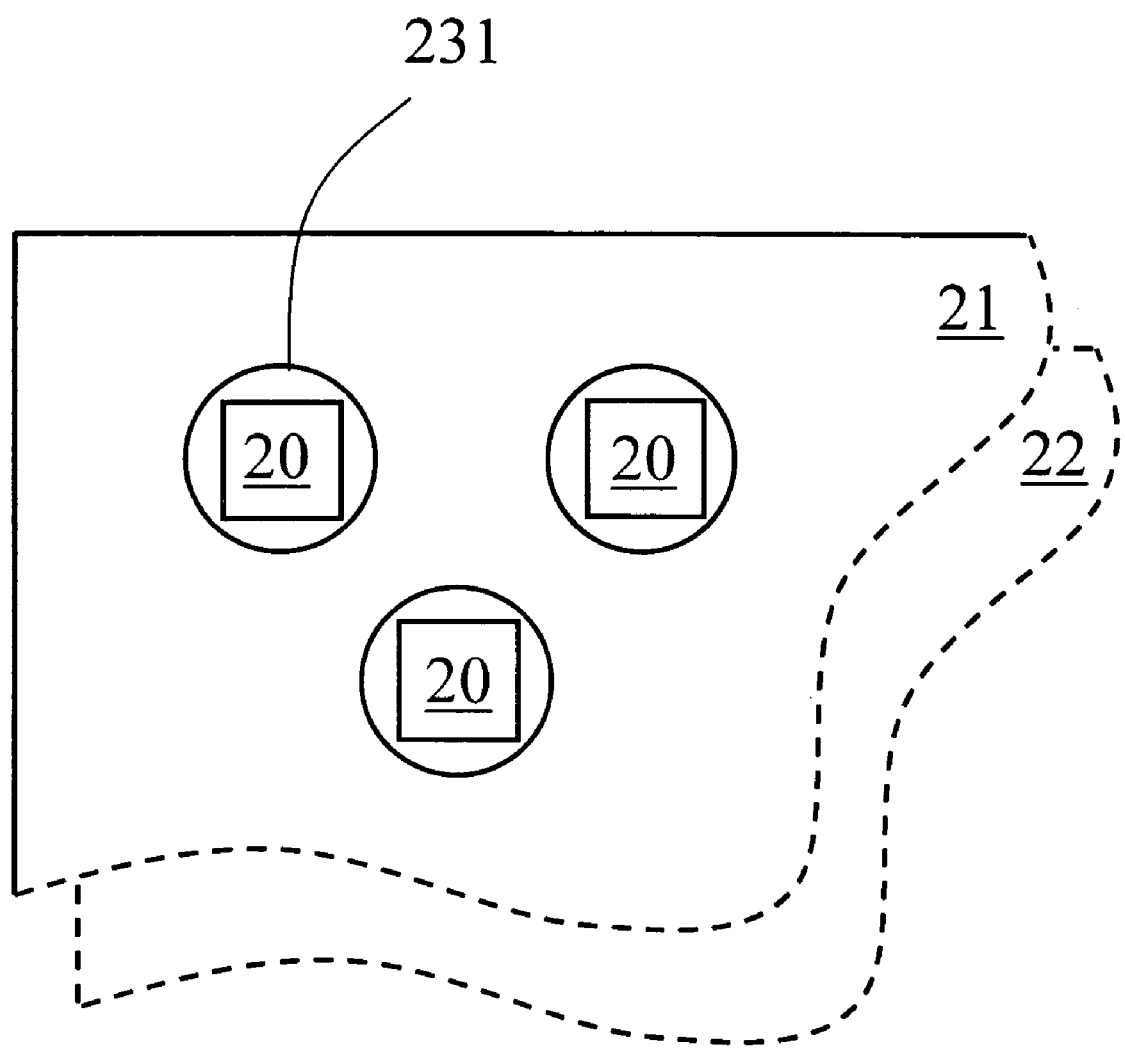
FIG. 3 shows the top plate of the present invention with through holes for the insertion of LEDs.

FIG. 3 shows the upper metal plate 21 of the present invention, overlaying a lower metal plate 22. A number of windows 231 are placed in the upper metal plate 21. Each window is large enough for an individual LED 20 to feed through.

Figure 4:
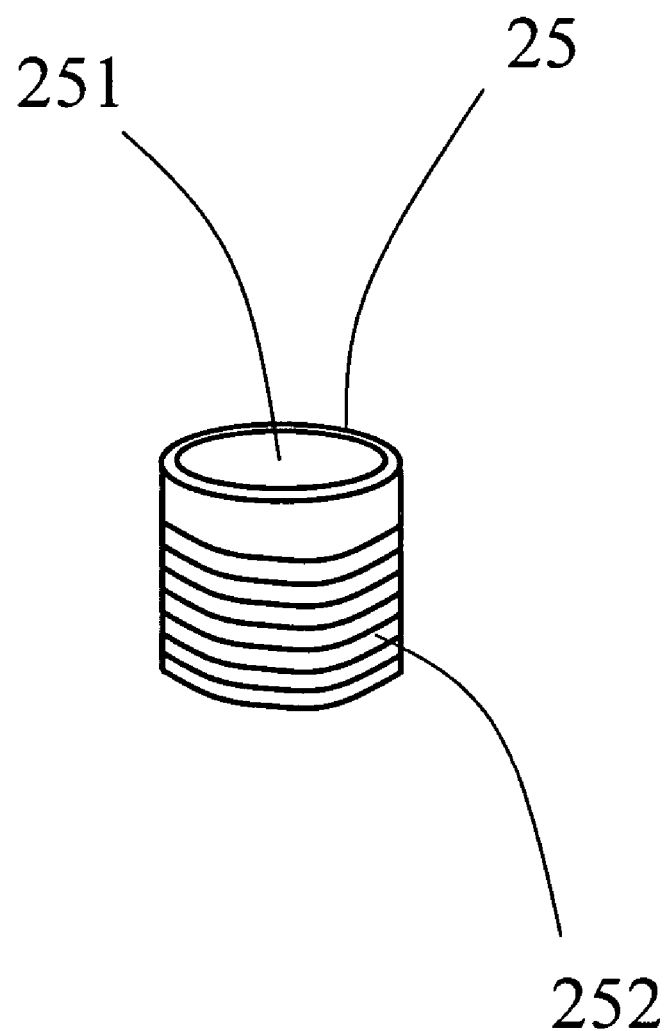
FIG. 4 shows the first embodiment of the threaded sleeve of the present invention to press against the underlying LED for making contact and for fixing the position of the LED.

FIG. 4 shows a metal plug 25 in the shape of a sleeve to fit into the windows 231 in FIG. 3. The plug has a core 251 and thread 252 for screwing to one of the windows 231.

Figure 5:
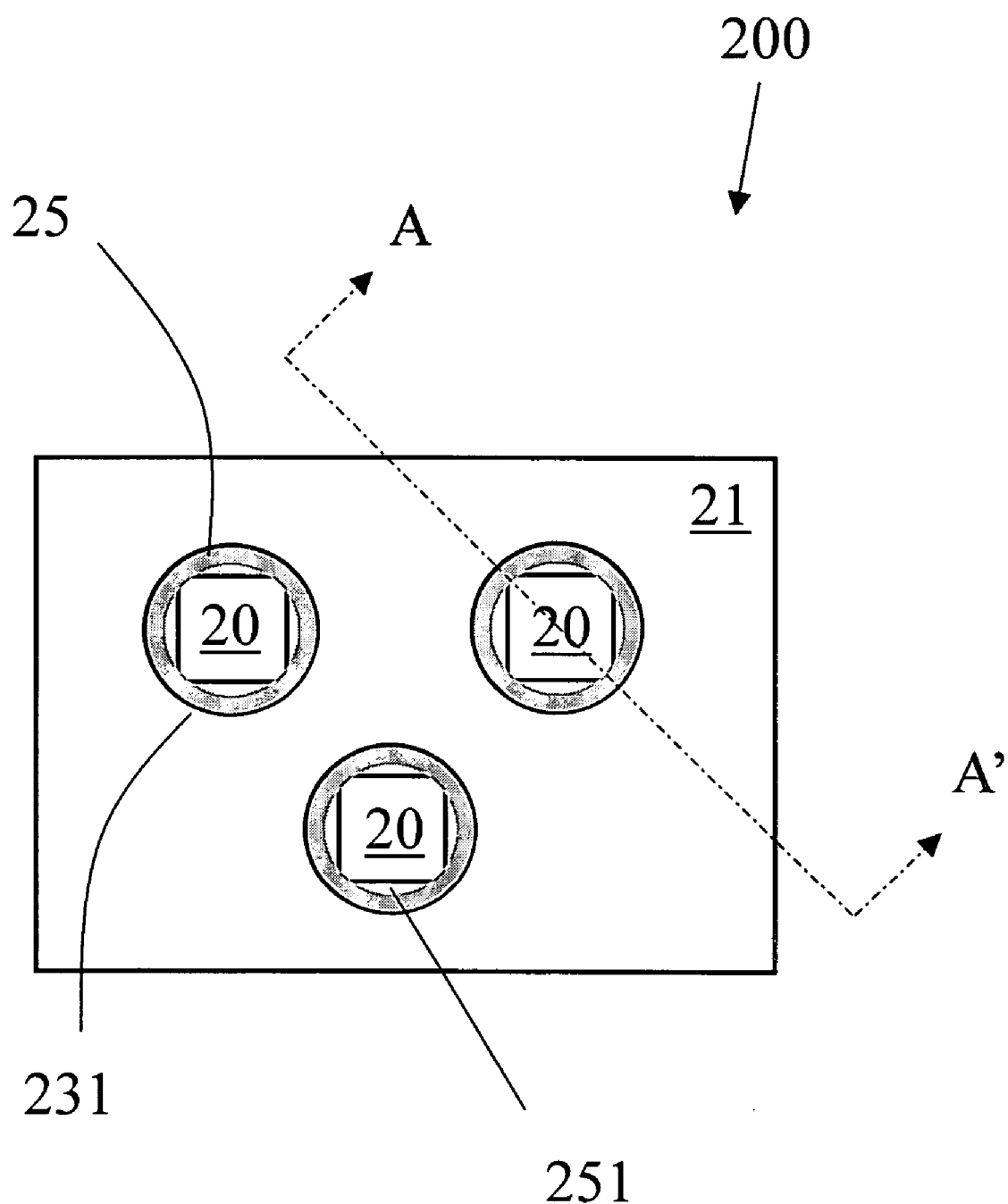
FIG. 5 shows the top view of the top plate after the insertion of the pressure sleeve.

FIG. 5 shows the top view of the upper metal plate 21 with the metal sleeve 25 inserted. The inner core of the sleeve is smaller than the overall dimension of the LED 20, so that each sleeve presses against the LED 20.

Figure 6:
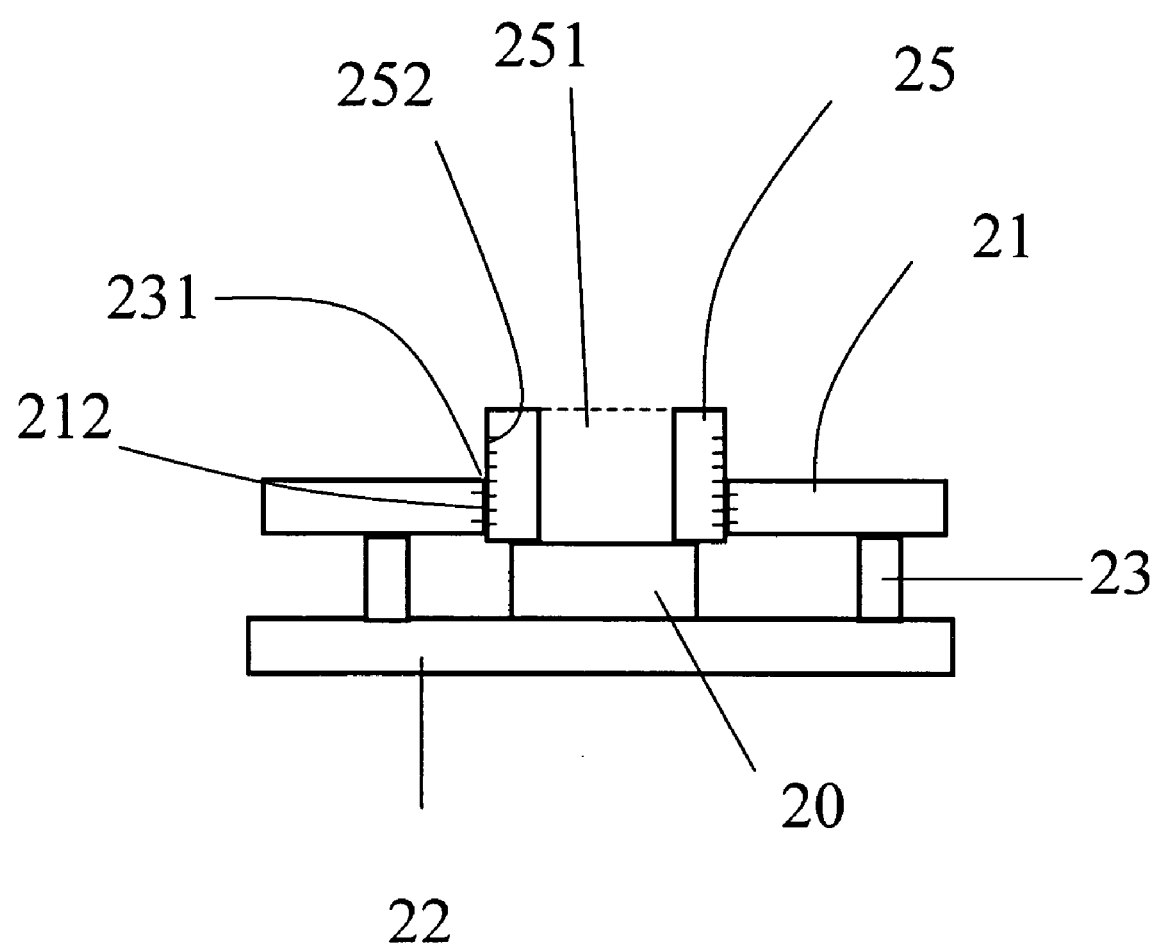
FIG. 6 shows the AA' sectional view of FIG. 5 of the LED unit with screw-thread sleeve.

FIG. 6 shows the cross-sectional view along the section line A-A' in FIG. 5 inside each window 231. Each window 231 on the upper metal plate 21 is threaded with teeth 212 to mate with the teeth 252 of the metal sleeve 25. The LED unit 20 is first inserted through the window 231 pressed against the lower metal plate 22, so that the bottom electrode of the LED 20 makes contact with the common lower metal plate 22. Then the metal sleeve 25 is screwed into the window 231 for the top electrode of the LED 20 to make contact with the upper metal plate 21, which is separated from the lower metal 22 by insulators 23. The core 251 is smaller than the top area of the LED light unit 20 to produce enough pressure and to insure electrical contact to the top electrode of the LED light unit 20. Since the metal sleeve 25 can be unscrewed, the LED light unit 20 can readily be replaced with ease.

Figure 7:
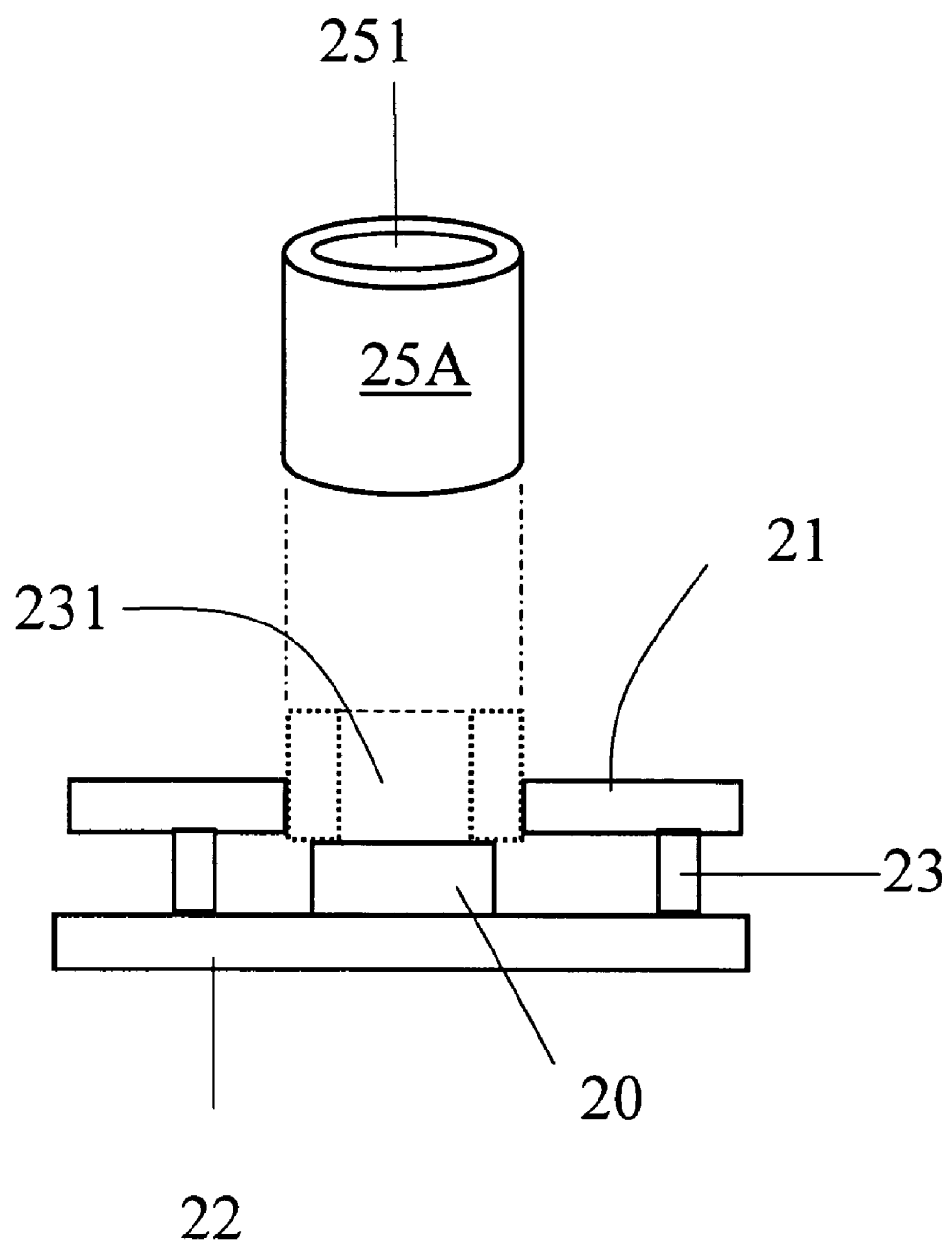
FIG. 7 shows a second embodiment of the invention with plug-in sleeve.

FIG. 7 shows a second embodiment of the present invention. The structure is similar to that in FIG. 6, except that the sleeve 25A is not threaded. The sleeve is plugged and snug-fit into a window 231 without any threads. Other elements refer to the corresponding elements with the same reference numerals in FIG. 6.

Figure 8:
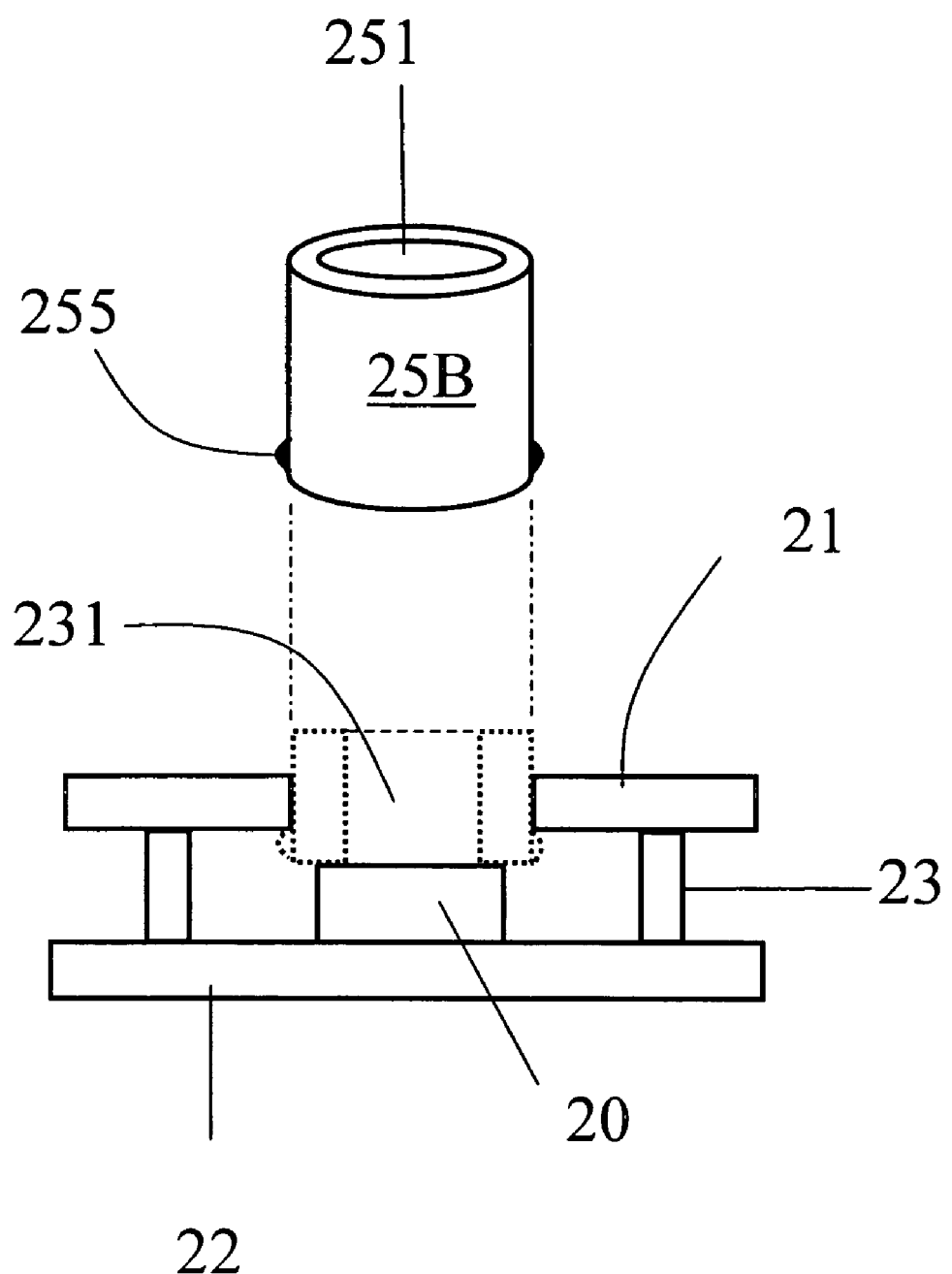
FIG. 8 shows a third embodiment of the present invention with snap-on button at the bottom of the sleeve.

FIG. 8 shows a third embodiment of the present invention. The structure is similar to that in FIG. 7, except that snap-on buttons 255 are placed at the bottom of the sleeve 25B. The snap-on buttons 255 insure that the metal sleeve 25B is well anchored in the window 231. Other elements refer to the corresponding elements with the same reference numerals in FIG. 7.

Figure 9:
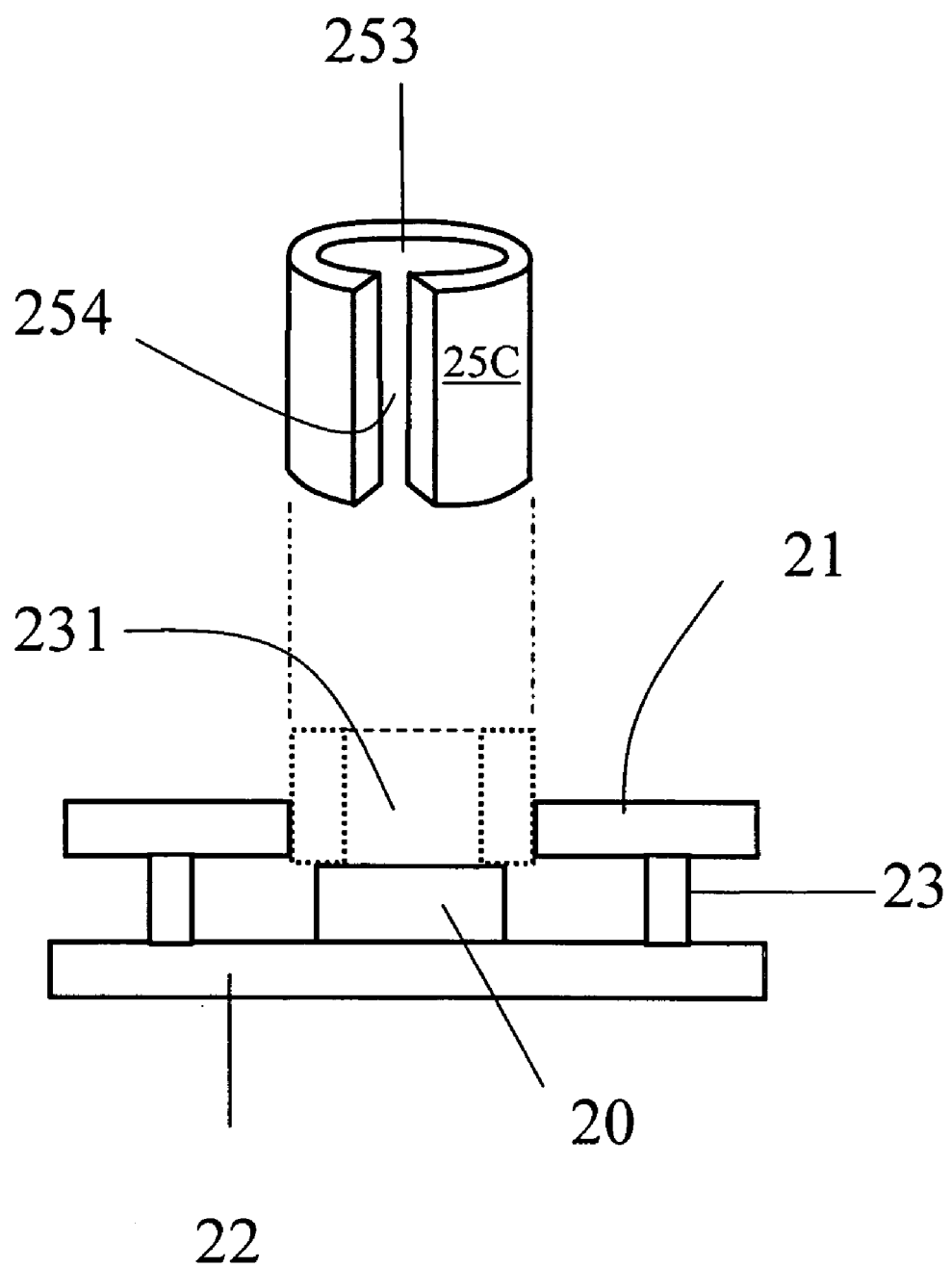
FIG. 9 shows a fourth embodiment of the present invention with elastic sleeve.

FIG. 9 shows a fourth embodiment of the present invention. The structure is similar to that in FIG. 7 except that the metal sleeve 25C has a cut 254, so that the sleeve becomes elastic and can be squeezed into and locked with the window 231 of the upper metal plate 21. Other elements refer to the corresponding elements with the same reference numerals in FIG. 7.

Figure 10:
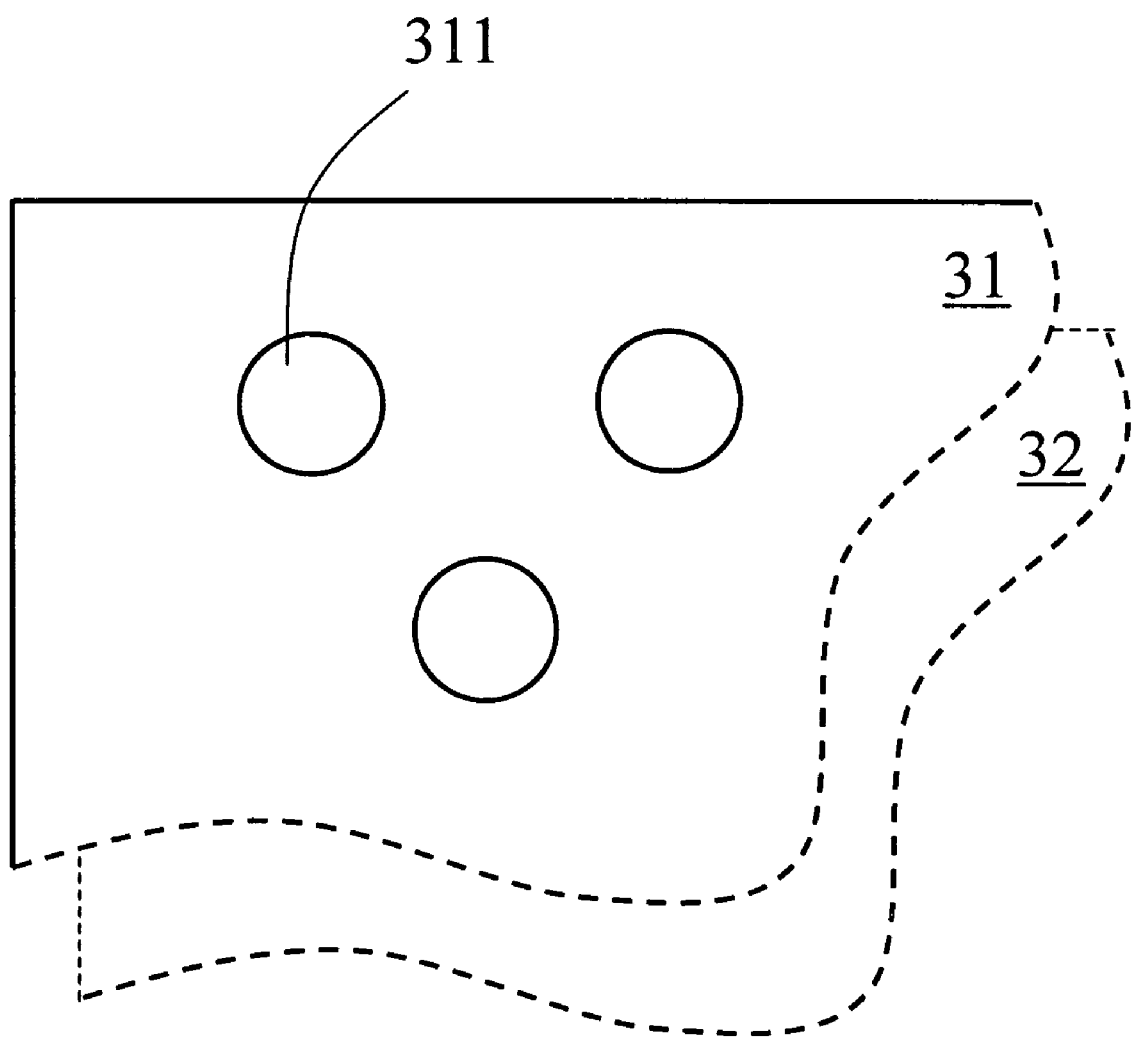
FIG. 10 shows a fifth embodiment of the present invention with upper metal plate windows smaller than the LED unit.
Figure 11:
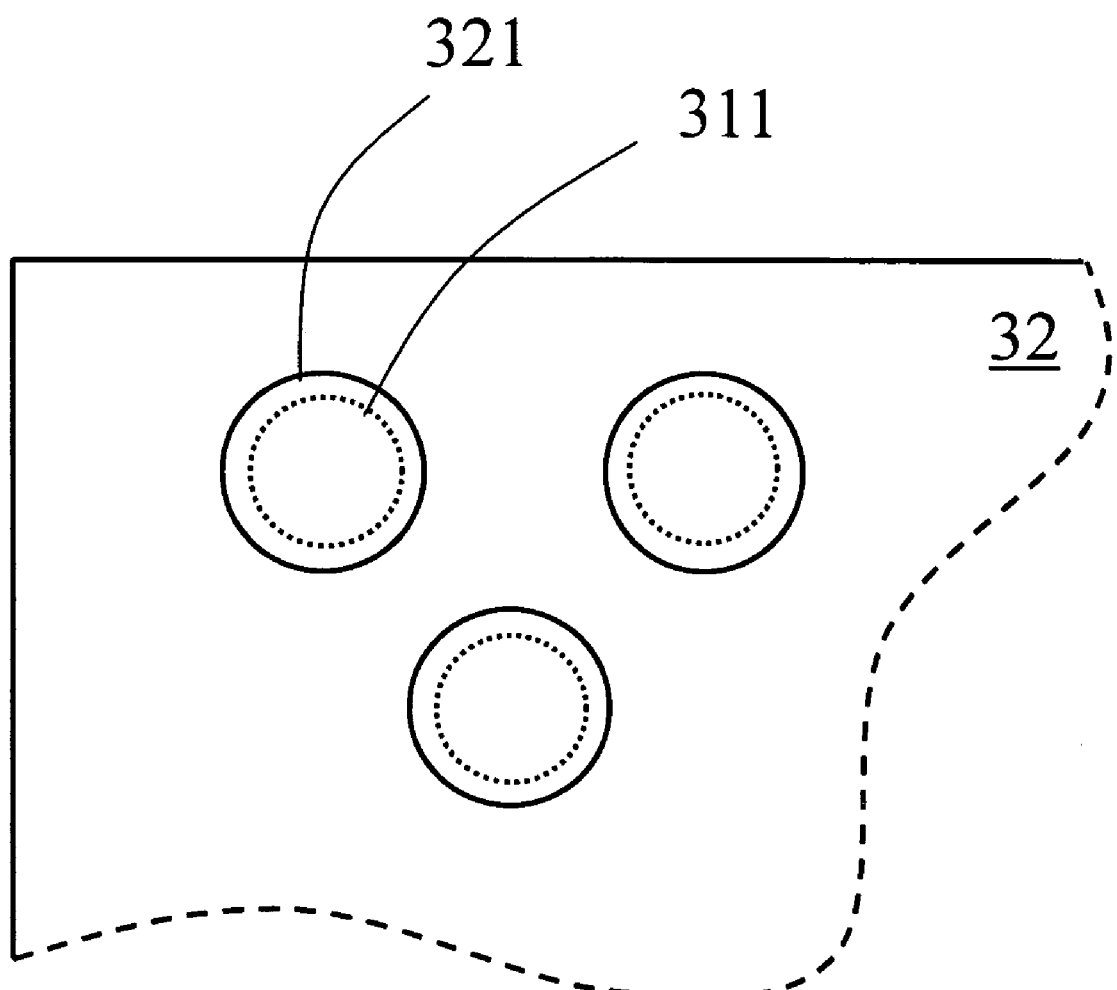
FIG. 11 shows a bottom view from the lower metal plate for the fifth embodiment.
Figure 12:
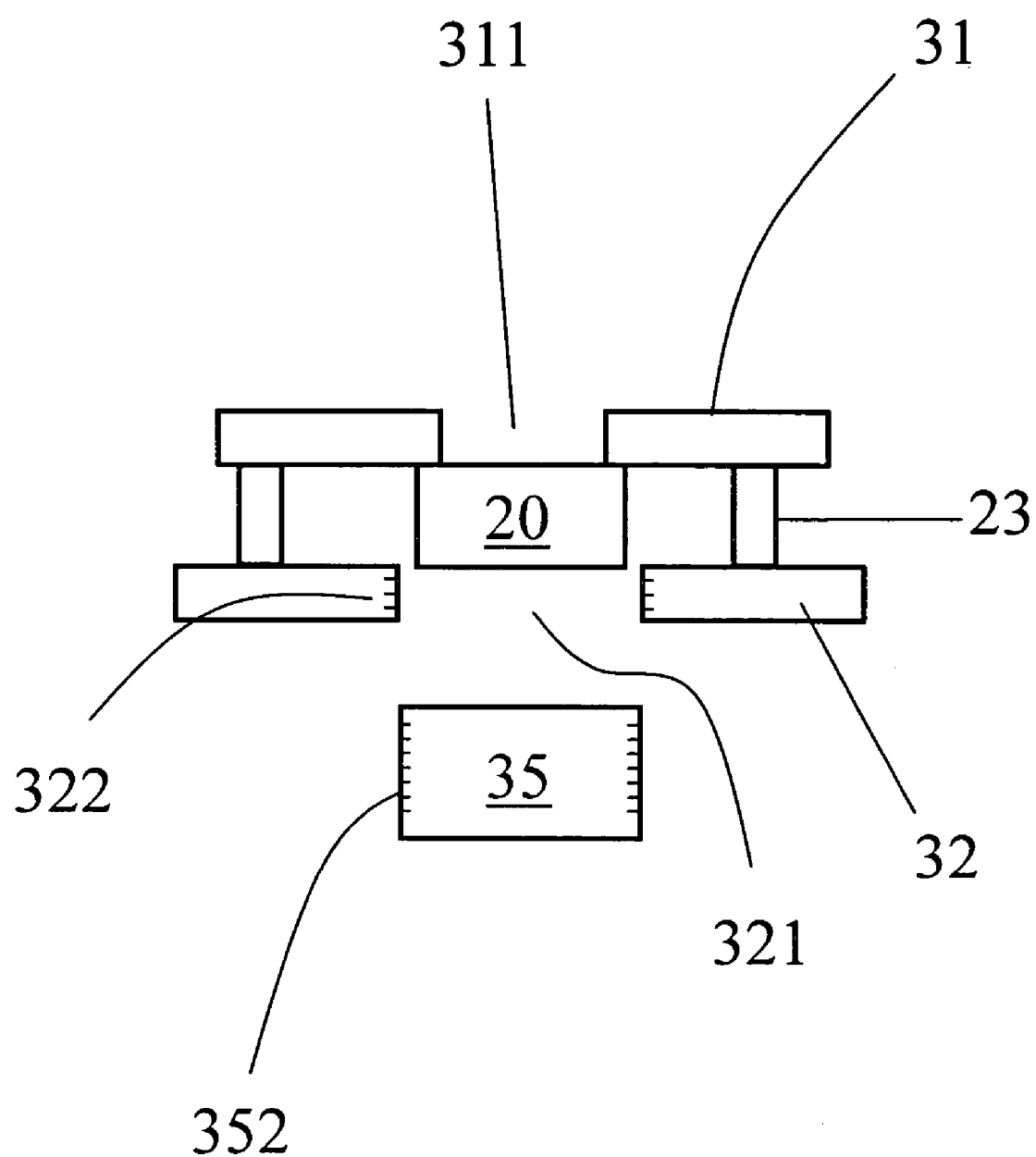
FIG. 12 shows the side view of the fifth embodiment with a bottom screw-thread plug for pushing up the LED unit.
Figure 13:
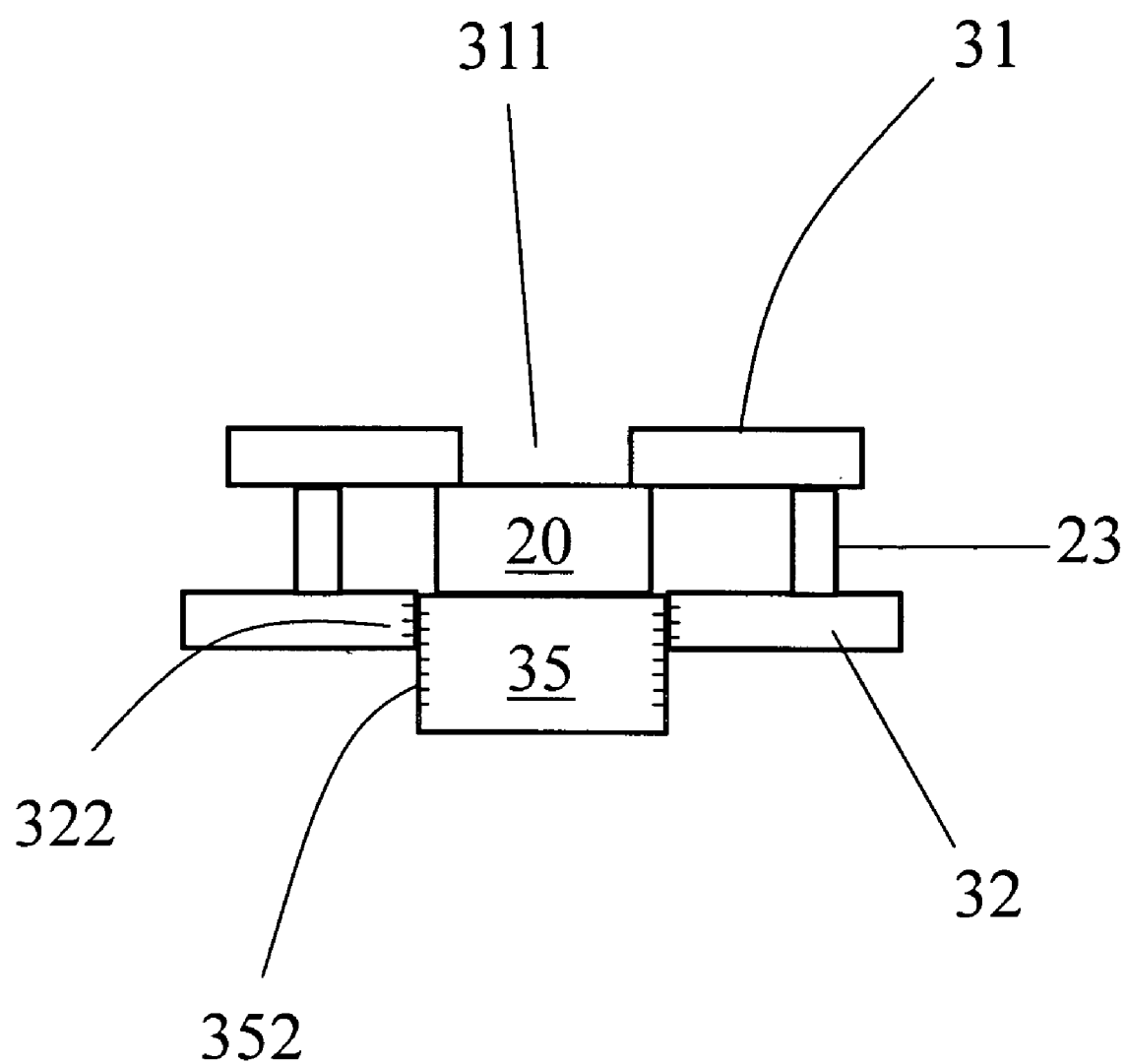
FIG. 13 shows the side view of the fifth embodiment with the plug pushed-up.

FIG. 10 shows a fifth embodiment of the present invention with the windows 311 in the upper metal plate 31 smaller than the LED light unit 20 and overlaying the lower metal plate 32. The lower metal plate 32 has larger holes 321 than the windows 311 as shown in FIG. 11. The size of each hole 321 is also larger than that of a LED light unit 20 as shown in FIG. 12 so that each LED light unit 20 can be inserted upward through the hole 321 in the lower metal plate 32, which is separated from the upper metal plate 31 by insulators 23. In FIG. 12, each hole 321 is threaded with teeth 322. A plug 35 is screwed upward by means of teeth 352 to mate with the teeth 322 in the hole 321 and to push the LED light unit 20 against the upper metal plate 31 as shown in FIG. 13. Since the window 311 in the upper metal plate 31 is smaller than the LED light unit 20, the LED light unit 20 is anchored below the upper metal plate 31 and makes the top electrode of the LED light unit 20 contact with the upper metal plate 31. The LED 20 can be readily replaced by unscrewing the plug 35.

Figure 14:
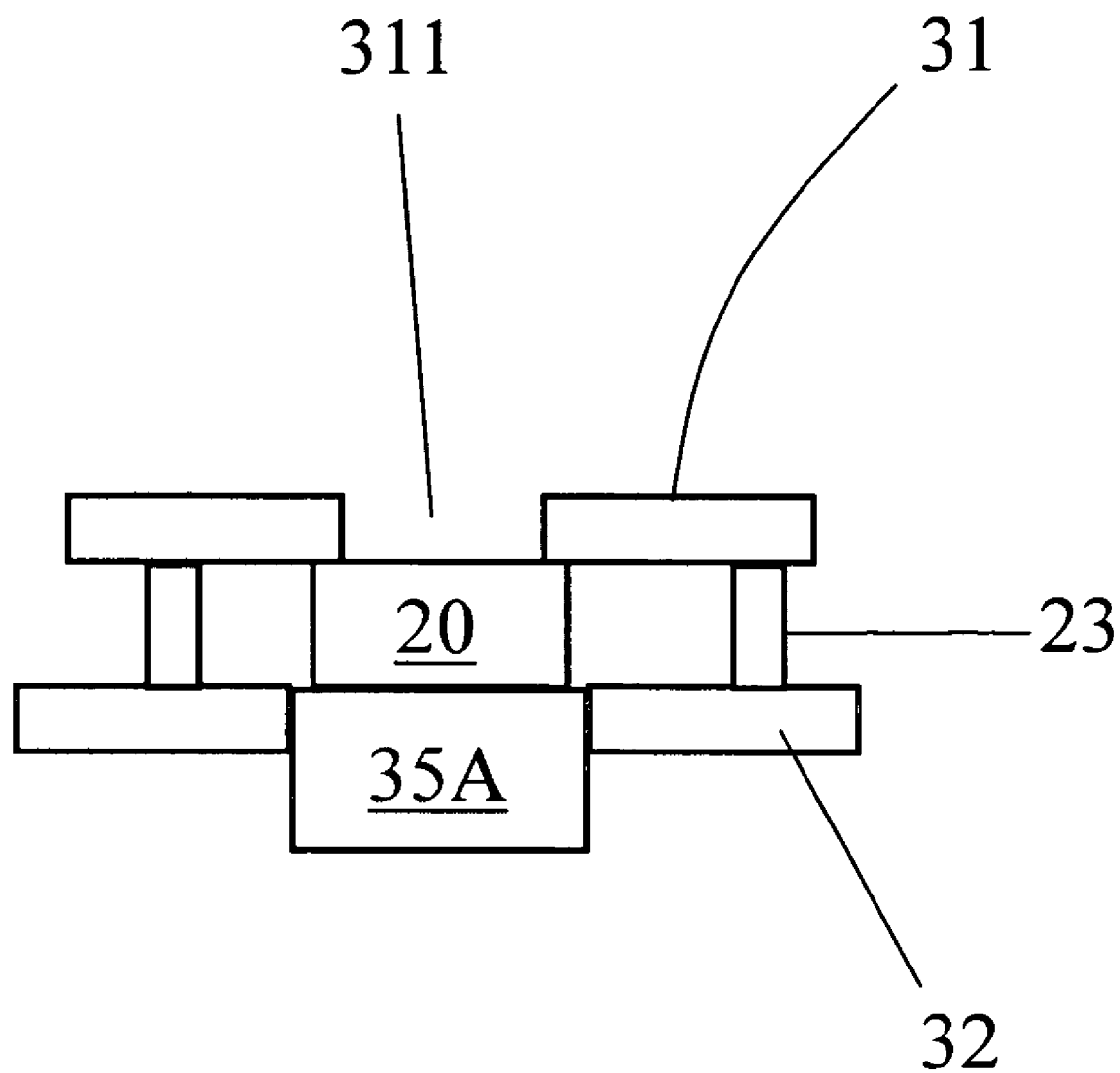
FIG. 14 shows a sixth embodiment of the present invention with a snug-fit bottom plug.

FIG. 14 shows a sixth embodiment of the present invention. The structure is similar to that in FIG. 13, except that the plug 35A is not threaded but snug-fit in the holes in the lower metal plate 32. Other elements correspond to the elements with the same reference numerals in FIG. 13.

Figure 15:
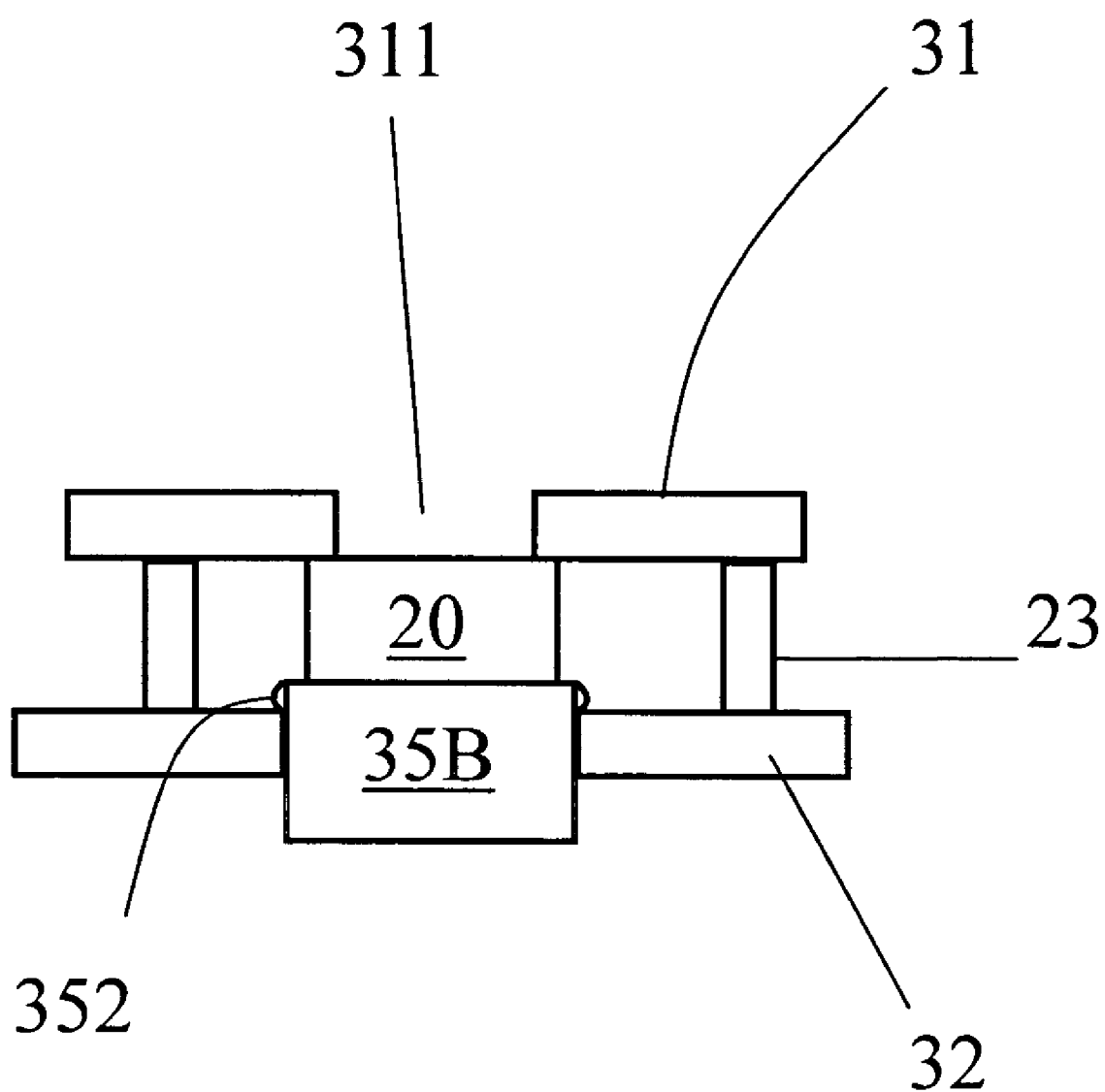
FIG. 15 shows a seventh embodiment of the present invention with a snap-on, push-up plug.

FIG. 15 shows a seventh embodiment of the present invention. The structure is similar to that in FIG. 14, except that snap-on buttons 352 are attached at the top edge of the plug 35B. The snap-on buttons 352 insures that the plug 35B is well anchored in the lower metal plate 32. The elements correspond to the elements with the same reference numerals in FIG. 14.

Figure 16:
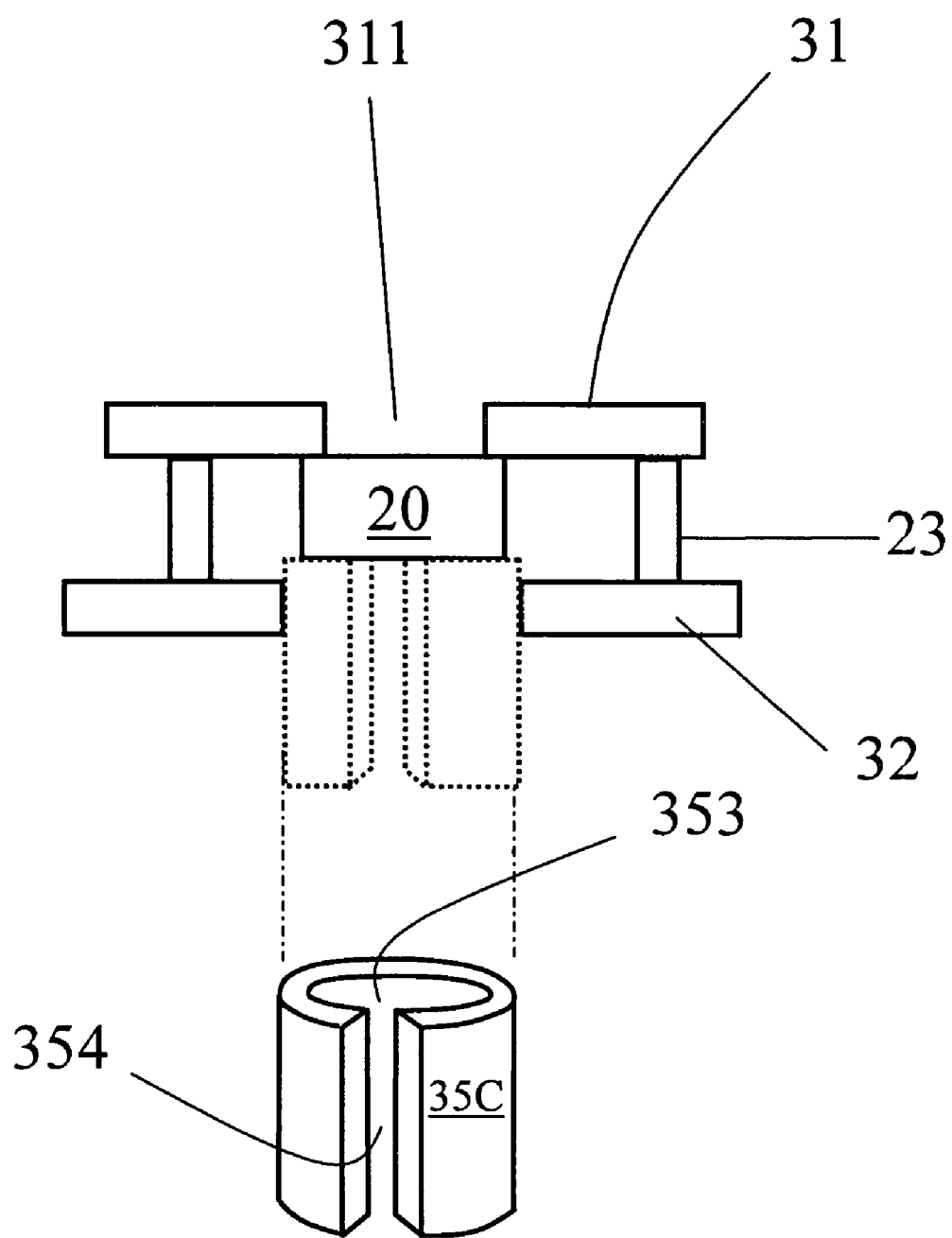
FIG. 16 shows an eighth embodiment of the present invention with an elastic push-up plug.

FIG. 16 shows an eighth embodiment of the present invention. The structure is similar to that in FIG. 14 except that the metal plug 35C is an elastic sleeve with a longitudinal cut 354 and the a core 353. The metal sleeve 35C can be squeezed to be inserted into the hole in the lower metal plate 32 to push against the LED light unit 20. After the sleeve 35C is inserted, the squeeze is released and the sleeve 35C expands to lock in the hole in the bottom plate 32 and makes contact with the bottom electrodes of the LED light unit 20. Other elements correspond to the elements with the same reference numerals in FIG. 14.

While the light emitting device in the foregoing paragraphs has been described as a light emitting diode 20, it is obvious that a laser diode can also be used as the light emitting device.

While the preferred embodiment of the invention have been described, it will be apparent to those skilled in the art that various modifications may be made in the embodiments without departing from the spirit of the present invention. Such modifications are all within the scope of this invention.

The invention claimed is:

1. A light display unit, comprising:
   a light emitting device having a top electrode and a bottom electrode;
   an upper metal plate for coupling to said top electrode and a lower metal plate for coupling to said bottom electrode;
   insulating spacers for separating said upper metal plate from said lower metal plate;
   an opening in said upper metal plate; and
   a conducting plug inserted in said opening to push the light emitting device against the lower metal plate,
   wherein said opening is large enough for said light emitting device to feed through, and
   wherein said plug is a sleeve with inner diameter smaller than the top surface of the light emitting device so that the sleeve makes contact with the top electrode of said light emitting device and the light from the light emitting device is transmitted through the core of the sleeve.

2. The light display unit as described in claim 1, wherein said sleeve is screwed into said opening by means of screw threads on the sleeve.

3. The light display unit as described in claim 1, wherein said sleeve is snug-fit into said first opening.

4. The light display unit as described in claim 1, wherein said sleeve has snap-on buttons around the bottom edge of the sleeve to anchor said sleeve.

5. The light display unit as described in claim 1, wherein said sleeve a longitudinal cut to render the sleeve elastic, so that the sleeve can be squeezed into said first opening and lock in said first opening upon releasing.

* * * * *